United States Patent
Pong et al.

(10) Patent No.: US 7,622,755 B2
(45) Date of Patent: Nov. 24, 2009

(54) PRIMITIVE CELL THAT IS ROBUST AGAINST ESD

(75) Inventors: Won-Hyung Pong, Gwangju-si (KR); Jong-Sung Jeon, Goyang-si (KR); Young-Chul Kim, Yong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 542 days.

(21) Appl. No.: 11/352,603

(22) Filed: Feb. 13, 2006

(65) Prior Publication Data

US 2006/0180869 A1 Aug. 17, 2006

(30) Foreign Application Priority Data

Feb. 12, 2005 (KR) .................. 10-2005-0011737

(51) Int. Cl.
*H01L 21/8238* (2006.01)
*H01L 29/423* (2006.01)
*H01L 29/78* (2006.01)

(52) U.S. Cl. .................. 257/173; 257/206; 257/369; 257/401; 257/E27.081; 257/E29.134

(58) Field of Classification Search ................ 257/173, 257/206, 369, 401, E27.081, E29.134
See application file for complete search history.

(56) References Cited

U.S. PATENT DOCUMENTS 6,838,708 B2 * 1/2005 Lin et al. .................. 257/173

FOREIGN PATENT DOCUMENTS

| JP | 2000-058660 | 2/2000 |
|---|---|---|
| JP | 2002-134720 | 5/2002 |
| KR | 1019930008907 | 9/1993 |
| KR | 1020010029998 A | 4/2001 |

* cited by examiner

*Primary Examiner*—Evan Pert
(74) *Attorney, Agent, or Firm*—F. Chau & Associates, LLC

(57) ABSTRACT

A primitive cell having a gate pattern that is robust against ESD is provided. The primitive cell comprises: a high finger PMOS transistor and a low finger NMOS transistor. The high finger PMOS transistor has a first terminal connected to a high power source, and a gate to which a control voltage is applied and which has a plurality of fingers. The low finger NMOS transistor has a first terminal connected to a low power source, a gate to which the control voltage is applied and which has a plurality of fingers, and a second terminal connected to a second terminal of the PMOS transistor. The number of the fingers of the gate of the NMOS transistor is smaller than the number of fingers of the gate of the PMOS transistor and the length of each of the fingers of the NMOS transistor is greater than the length of each of the fingers of the PMOS transistor.

12 Claims, 2 Drawing Sheets

PRIMITIVE CELL THAT IS ROBUST AGAINST ESD

CROSS-REFERENCE TO RELATED PATENT APPLICATION

This application claims priority to Korean Patent Application No. 10-2005-0011737, filed on Feb. 12, 2005, in the Korean Intellectual Property Office, the disclosure of which is incorporated by reference herein in its entirety.

BACKGROUND OF THE INVENTION

1. Technical Field

The present invention relates to a primitive cell, and more particularly, to a primitive cell having a gate pattern that is robust against electrostatic discharge (ESD).

2. Discussion of the Related Art

ESD is an electric current driven by an excess electric charge typically stored on an insulating object of a chip. Because chips are made from semiconductor materials such as silicon and insulating materials such as silicon dioxide, which can break down if exposed to ESD, precautions have been developed to guard against ESD.

For example, when an ESD stress is applied to a chip, an ESD protection circuit bypasses most of the ESD stress. However, the ESD protection circuit may not be 100 percent effective. As a result, damage may occur in an internal circuit of the chip, and when damage does occur, it is difficult to determine the location and extent of the damage.

FIG. 1 illustrates the layout of a primitive cell 100 implemented by a high finger gate transistor.

Referring to FIG. 1, the primitive cell 100 includes a PMOS transistor including an active region 130 that is formed inside a well 110 and a portion of a gate pattern 160 formed on the active region 130, and an NMOS transistor including an active region 150 that is formed on a substrate (not shown) and a portion of the gate pattern 160 formed on the active region 150. An electrically stable bias voltage from a high voltage source is applied to the well 110 via an active region 120, and an electrically stable bias voltage from a low voltage source or a ground voltage is applied to the substrate via an active region 140.

Although not illustrated in FIG. 1, a portion of the active region 130 separated by the gate pattern 160 is supplied with a high power source voltage and a portion of the active region 150 separated by the gate pattern 160 is supplied with a low power source voltage. The remaining portions of the active region 130 and the active region 150 are connected to each other to form an output terminal of an inverter.

Referring to FIG. 1, the PMOS transistor and the NMOS transistor form a finger gate transistor whose gates are spread like fingers to maximize the use of a predetermined active region and to increase the ratio of the width to the length of the gates of the finger gate transistor. The finger gate transistor is designed such that there are more finger gates in the PMOS transistor than in the NMOS transistor. This is due to the difference between the mobility of electrons and holes in the PMOS transistor and the NMOS transistor.

In the PMOS transistor and the NMOS transistor, ESD inducing components that accumulate in a common section thereof may adversely affect the gates of the PMOS and NMOS transistors.

For example, when a low power source is applied to the gates of the PMOS transistor and the NMOS transistor, the PMOS transistor is turned on and the NMOS transistor is turned off. Since the PMOS transistor and the NMOS transistor have high finger gates having many fingers with narrow widths and short lengths, the finger gates tend not to be robust against an applied ESD stress. Thus, the ESD components accumulated in a drain of a high finger NMOS transistor may cause damage to a weak finger gate of the NMOS transistor.

Further, even if a difference in the robustness of the multi-finger gates of the PMOS and the NMOS transistors against ESD is small, the finger gate of the NMOS transistor damaged by the ESD may still be destroyed. As such a need exists for a gate pattern for a primitive cell that is robust against ESD.

SUMMARY OF THE INVENTION

According to an aspect of the present invention, there is provided a primitive cell comprising: a high finger PMOS transistor comprising: a first terminal connected to a high power source; and a gate to which a control voltage is applied and which has a plurality of fingers; and a low finger NMOS transistor comprising: a first terminal connected to a low power source; a gate to which the control voltage is applied and which has a plurality of fingers; and a second terminal connected to a second terminal of the high finger PMOS transistor, wherein the number of fingers of the gate of the low finger NMOS transistor is smaller than the number of fingers of the gate of the high finger PMOS transistor and the length of each of the fingers of the low finger NMOS transistor is longer than the length of each of the fingers of the gate of the high finger PMOS transistor.

The gates of the high finger PMOS transistor and the low finger NMOS transistor are composed of the same material when they are not electrically connected, or are composed of different materials when the gates of the high finger PMOS transistor and the low finger NMOS transistor are electrically connected.

The material forming the gates of the high finger PMOS transistor and the low finger NMOS transistor is polycrystalline silicon or metal. The material connecting the gates of the high finger PMOS transistor and the low finger NMOS transistor is metal.

The high finger PMOS transistor and the low finger NMOS transistor are connected by a metal layer. The gate of the low finger NMOS transistor extends in the same direction as the low power source. The fingers of the gate of the low finger NMOS transistor have wide and narrow regions.

Regions between the gate fingers of the low finger NMOS transistor that are separated by a large distance comprise contact windows. Regions adjacent to the gate fingers of the low finger NMOS transistor that are separated by a small distance comprise contact windows. The gate of the low finger NMOS transistor may form a closed loop.

According to another aspect of the present invention, there is provided a primitive cell comprising: a PMOS transistor having a multi-finger gate; and a NMOS transistor having a multi-finger gate, wherein the number of fingers of the multi-finger gate of the NMOS transistor is less than the number of fingers of the multi-finger gate of the PMOS transistor.

The NMOS transistor comprises an active region. The NMOS transistor extends along the length of the active region. The NMOS transistor extends along the active region from a first end at a first side of the active region to a second side of the active region in a horizontal direction and back to a second end at the first side of the active region in a horizontal direction.

The fingers of the multi-finger gate of the NMOS transistor are parallel to each other. The fingers of the multi-finger gate of the NMOS transistor form a zig-zag pattern.

The multi-finger gate of the PMOS transistor and the multi-finger gate of the NMOS transistor are connected. The multi-finger gate of the PMOS transistor and the multi-finger gate of the NMOS transistor are connected by polycrystalline silicon or metal.

When the multi-finger gate of the PMOS transistor and the multi-finger gate of the NMOS transistor are connected by polycrystalline silicon they are connected by a polycrystalline layer. When the multi-finger gate of the PMOS transistor and the multi-finger gate of the NMOS transistor are connected by metal they are connected by a metal layer.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
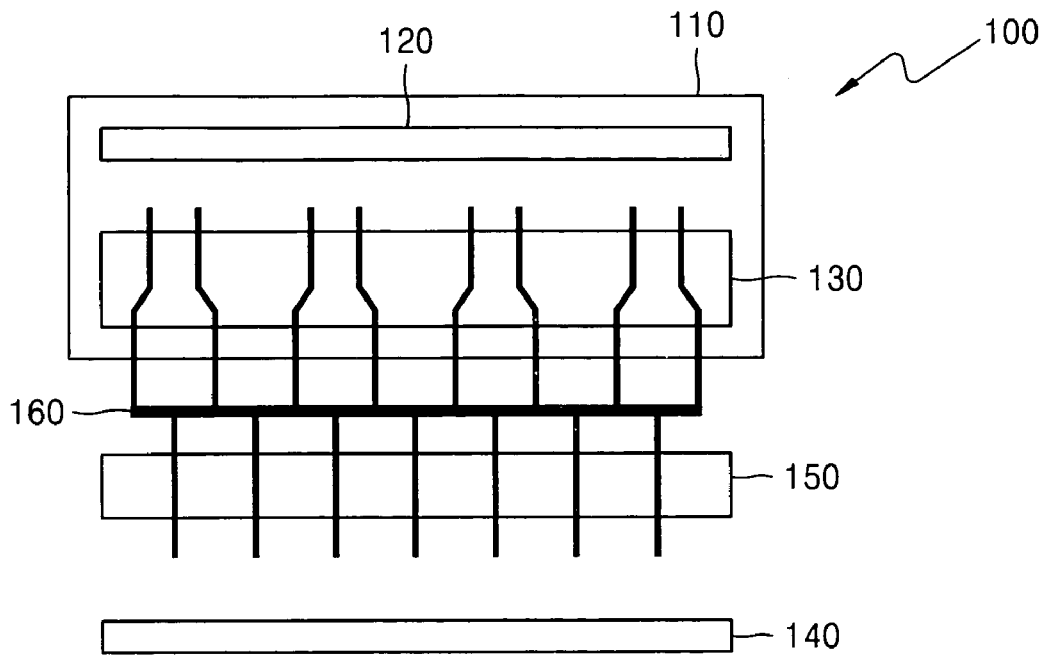
FIG. 1 illustrates the layout of a primitive cell implemented by a high finger gate transistor.

Hereinafter, exemplary embodiments of the present invention will be described in detail with reference to the attached drawings. Like reference numerals in the drawings denote like elements.

Figure 2:
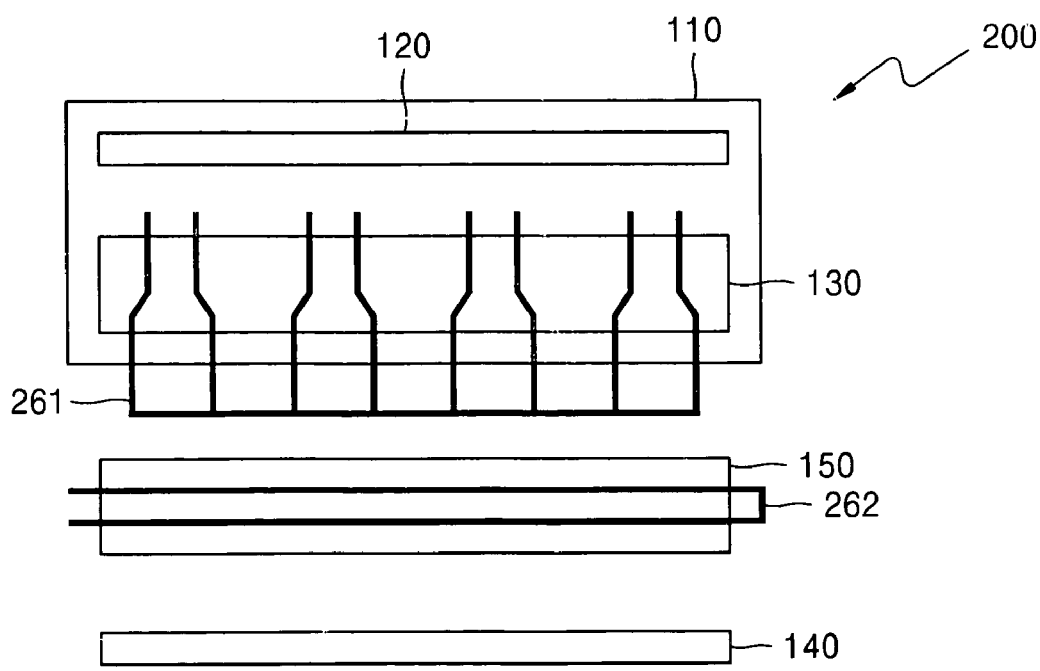
FIG. 2 illustrates the layout of a primitive cell according to an exemplary embodiment of the present invention.

FIG. 2 illustrates the layout of a primitive cell 200 according to an embodiment of the present invention.

Referring to FIG. 2, since the primitive cell 200 includes the same or similar components as those shown in the primitive cell 100 of FIG. 1, except gate patterns 261 and 262, detailed descriptions of components common to the primitive cells 100 and 200 are not repeated.

As shown in FIG. 2, the gate pattern 262 of the NMOS transistor extends along the length of the active region 150. In other words, the gate pattern 262 extends along the active region 150 from a first end at the left side of the active region 150 to the right side of the active region 150 in a horizontal direction and back to a second end at the left side of the active region 150 in a horizontal direction.

According to an exemplary embodiment of the present invention, the number of fingers of the gate pattern 262 of the NMOS transistor is two while the number of fingers of the gate pattern 261 of the PMOS transistor is eight. In addition, the length of the gate pattern 262 is increased as compared to that of the portion of the gate pattern 160 in the NMOS transistor of FIG. 1.

Thus, by reducing the number of fingers and increasing the length of the gate pattern 262, a difference in the robustness between the fingers of the gate pattern 261 and the fingers of the gate pattern 262 against ESD is decreased and the robustness of the primitive cell 200 against ESD may be improved.

Although not shown in FIG. 2, if the gate patterns 261 and 262 form an inverter, the gate patterns 261 and 262 should be electrically connected to each other. Further, although the gate patterns 261 and 262 are illustrated as being separate from each other in FIG. 2, the gate patterns 261 and 262 may be directly connected or indirectly connected by using metal or polycrystalline silicon in a subsequent processing.

In addition, although the left side of the gate pattern 262 is open at first and second ends as illustrated in FIG. 2, the open ends of the gate pattern 262 may be connected to form a closed loop.

Figure 3:
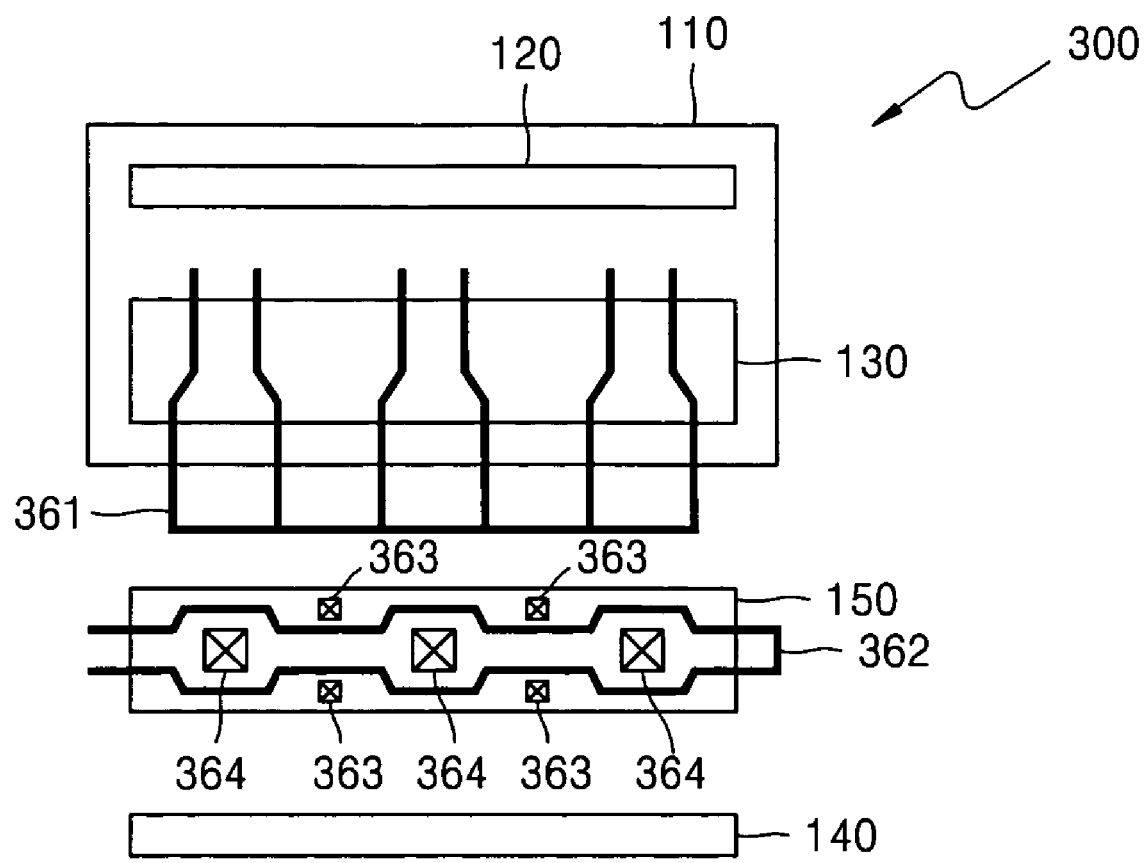
FIG. 3 illustrates the layout of a primitive cell according to another exemplary embodiment of the present invention.

FIG. 3 illustrates the layout of a primitive cell 300 according to another embodiment of the present invention.

Referring to FIG. 3, since the primitive cell 300 includes the same or similar components as those shown in the primitive cell 200 of FIG. 2, except a gate pattern 362 and contact windows 363 and 364, detailed descriptions of components common to the primitive cells 200 and 300 are not repeated.

As shown in FIG. 3, the gate pattern 362 of the NMOS transistor extends along the length of the active region 150. In other words, the gate pattern 362 extends along the active region 150 from a first end at the left side of the active region 150 to the right side of the active region 150 in a horizontal direction in a zig-zag pattern and back to a second end at the left side of the active region 150 in a horizontal direction in a zig-zag pattern.

The gate pattern 362 can be used when the width of an active region 150 is narrow. In addition, the contact windows 363 and 364, which are disposed in wide and narrow portions of the active region 150, can be used so that elements of a circuit for use with the primitive cell 300 can be electrically connected thereto.

For example, the contact windows 364 are disposed in regions between the gate fingers of the low finger NMOS transistor that are separated by a large distance and the contact windows 363 are disposed in regions adjacent to the gate fingers of the low finger NMOS transistor that are separated by a small distance.

Similar to that as shown in FIG. 2, by reducing the number of fingers and increasing the length of the gate pattern 362, a difference in the robustness between the fingers of the gate pattern 361 and the fingers of the gate pattern 362 against ESD is decreased and the robustness of the primitive cell 300 against ESD may be improved.

Referring now to FIGS. 2 and 3, when metal is used to connect the PMOS transistor to the NMOS transistor, at least two electrically isolated metal layers may be used. In addition, when a polycrystalline silicon is used to connect the PMOS transistor and the NMOS transistor, one or two polycrystalline layers may be used. Further, the gate of the low finger NMOS transistor may extend in the same direction as a power source applied to the substrate via the active region 140.

In addition, although the layout of an inverter has been described as the primitive cell in FIGS. 2 and 3, it is to be understood by one of ordinary skill in the art that any logic circuit that can be implemented by a CMOS transistor with the gate pattern 262 or 362 can be used as a primitive cell.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A primitive cell, comprising:
    a high finger PMOS transistor comprising: a first terminal connected to a high power source; and a gate to which a control voltage is applied and which has a plurality of fingers; and
    a low finger NMOS transistor comprising: a first terminal connected to a low power source; a gate to which the control voltage is applied and which has a plurality of fingers; and a second terminal connected to a second terminal of the high finger PMOS transistor, wherein the number of fingers of the gate of the low finger NMOS transistor is smaller than the number of fingers of the gate of the high finger PMOS transistor and the fingers of the high finger PMOS transistor extend along a narrow width of an active region and the fingers of the low finger NMOS transistor extend along a wide width of another active region.

2. The primitive cell of claim 1, wherein the gates of the high finger PMOS transistor and the low finger NMOS transistor are comprised of the same material when they are not electrically connected, or are comprised of different materials when the gates of the high finger PMOS transistor and the low finger NMOS transistor are electrically connected.

3. The primitive cell of claim 2, wherein the material forming the gates of the high finger PMOS transistor and the low finger NMOS transistor is polycrystalline silicon or metal.

4. The primitive cell of claim 2, wherein the material connecting the gates of the high finger PMOS transistor and the low finger NMOS transistor is metal.

5. The primitive cell of claim 4, wherein the high finger PMOS transistor and the low finger NMOS transistor are connected by a metal layer.

6. The primitive cell of claim 1, wherein the gate of the low finger NMOS transistor extends in the same direction as the low power source.

7. The primitive cell of claim 1, wherein the gate of the low finger NMOS transistor forms a closed loop.

8. A primitive cell, comprising:
   a PMOS transistor having a multi-finger gate; and
   a NMOS transistor having a multi-finger gate, wherein the number of fingers of the multi-finger gate of the NMOS transistor is less than the number of fingers of the multi-finger gate of the PMOS transistor, and
   wherein the fingers of the PMOS transistor extend along a narrow width of an active region and the fingers of the NMOS transistor extend along a wide width of another active region.

9. The primitive cell of claim 8, wherein the multi-finger gate of the PMOS transistor and the multi-finger gate of the NMOS transistor are connected.

10. The primitive cell of claim 9, wherein the multi-finger gate of the PMOS transistor and the multi-finger gate of the NMOS transistor are connected by polycrystalline silicon or metal.

11. The primitive cell of claim 10, wherein when the multi-finger gate of the PMOS transistor and the multi-finger gate of the NMOS transistor are connected by polycrystalline silicon they are connected by a polycrystalline layer.

12. The primitive cell of claim 10, wherein when the multi-finger gate of the PMOS transistor and the multi-finger gate of the NMOS transistor are connected by metal they are connected by a metal layer.

* * * * *